United States Patent
Ng et al.

(10) Patent No.: US 8,039,388 B1
(45) Date of Patent: Oct. 18, 2011

(54) MAIN SPACER TRIM-BACK METHOD FOR REPLACEMENT GATE PROCESS

(75) Inventors: Jin-Aun Ng, Hsinchu (TW); Yu-Ying Hsu, Pingzhen (TW); Chi-Ju Lee, Guiren Township (TW); Sin-Hua Wu, Zhubei (TW); Bao-Ru Young, Zhubei (TW); Harry-Hak-Lay Chuang, Hsinchu (TW)

(73) Assignee: Taiwam Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/730,375

(22) Filed: Mar. 24, 2010

(51) Int. Cl.
*H01L 21/4763* (2006.01)

(52) U.S. Cl. ......... 438/630; 257/E21.199; 257/E21.296; 257/E21.438; 438/744; 438/745; 438/791

(58) Field of Classification Search ............ 257/E21.199, 257/E21.296, E21.438; 438/630, 744, 745, 438/791
See application file for complete search history.

(56) References Cited

U.S. PATENT DOCUMENTS

| | | | |
|---|---|---|---|
| 6,821,713 B1 * | 11/2004 | Holbrook et al. | ............ 430/313 |
| 2005/0186747 A1 | 8/2005 | Amos et al. | |
| 2007/0241378 A1 | 10/2007 | Aritome | |
| 2008/0206973 A1 * | 8/2008 | Johnson et al. | ............ 438/585 |
| 2008/0303060 A1 | 12/2008 | Han et al. | |

* cited by examiner

*Primary Examiner* — Asok Sarkar
(74) *Attorney, Agent, or Firm* — Lowe, Hauptman Ham & Berner, LLP

(57) ABSTRACT

The embodiments of methods described in this disclosure for trimming back nitride spacers for replacement gates allows the hard mask layers (or hard mask) to protect the polysilicon above the high-K dielectric during trim back process. The process sequence also allows determining the trim-back amount based on the process uniformity (or control) of nitride deposition and nitride etchback (or trimming) processes. Nitride spacer trim-back process integration is critical to avoid creating undesirable consequences, such as silicided polyisicon on top of high-K dielectric described above. The integrated process also allows widening the space between the gate structures to allow formation of silicide with good quality and allow contact plugs to have sufficient contact with the silicide regions. The silicide with good quality and good contact between the contact plugs and the silicide regions increase the yield of contact and allows the contact resistance to be in acceptable and workable ranges.

21 Claims, 8 Drawing Sheets

MAIN SPACER TRIM-BACK METHOD FOR REPLACEMENT GATE PROCESS

FIELD

This application relates to main spacer trim-back film and, more particularly, to main spacer trim-back for replacement gate process.

BACKGROUND

The semiconductor integrated circuit (IC) industry has experienced rapid growth. Technological advances in IC materials and design have produced generations of ICs where each generation has smaller and more complex circuits than the previous generation. Such advances have increased the complexity and challenges of processing and manufacturing of ICs.

In IC manufacturing, spacers are formed on the sidewalls of gate stacks. Spacers are needed to isolate the gate stacks from neighboring silicide regions. However, spacers make the spaces between gate stacks become narrower. As technology advances, the distance (or space) between gate stacks become smaller and the aspect ratios of such space become higher. The small distance and high aspect ratio of the space between neighboring gate stacks degrade the quality of silicide formed between the neighboring gate stacks, which results in high resistivity and poor contact yield.

Based on the problems described above, there is a need for processes that would increase the distance between adjacent gate stacks to improve silicide quality and to improve contact yield.

SUMMARY

The embodiments of methods described below for trimming back nitride spacers for replacement gates allows the hard mask layers (or hard mask) to protect the polysilicon above the high-K dielectric during trim back process. The process sequence also allows determining the trim-back amount based on the process uniformity (or control) of nitride deposition and nitride etch-back (or trimming) processes. Nitride spacer trim-back process integration is critical to avoid creating undesirable consequences, such as silicided polyisicon on top of high-K dielectric described above. The integrated process also allows widening the space between the gate structures to allow formation of silicide with good quality and allow contact plugs to have sufficient contact with the silicide regions. Silicide with good quality and good contact between the contact plugs and the silicide regions increase the yield of contact and allows the contact resistance to be in acceptable and workable ranges.

In one embodiment, a method of trimming back main nitride spacers of replacement gate structures on a substrate is provided. The method includes an operation of forming main nitride spacers for replacement gate structures on the substrate. The replacement gate structures have a high dielectric constant (high-K) dielectric layer and a dummy polysilicon layer over the high-K dielectric layer, and a hard mask with an oxide layer over a nitride layer. The method also includes an operation of performing source and drain implants. Source and drain patterns are formed to allow source and drain implants to be performed on desired regions of the substrate and the source and drain patterns are removed from the substrate after the source and drain implants are performed. The method further includes an operation of trimming back the main nitride spacers to increase a space between two adjacent replacement gate structures on the substrate to allow proper formation of metal silicide by subsequent processing and to increase contact yield. Additionally, the method includes an operation of performing source and drain anneal, and an operation of forming the metal silicide on the substrate.

In another embodiment, a method of trimming back main nitride spacers of replacement gate structures on a substrate is provided. The method includes an operation of forming main nitride spacers for replacement gate structures on the substrate. The replacement gate structures have a high dielectric constant (high-K) dielectric layer and a dummy polysilicon layer over the high-K dielectric layer, and a hard mask with an oxide layer over a nitride layer. The method also includes an operation of performing source and drain implants. Source and drain patterns are formed to allow source and drain implants to be performed on desired regions of the substrate and the source and drain patterns are removed from the substrate after the source and drain implants are performed. The method further includes an operation of performing first trim-back of the main nitride spacers to increase a space between two adjacent replacement gate structures on the substrate to allow proper formation of metal silicide by subsequent processing and to increase contact yield, and an operation of performing source and drain anneal. In addition, the method includes an operation of implanting polysilicon on the substrate before the forming of the metal silicide. The implanted polysilicon improves the quality of the metal silicide formed. The first trim-back of the main nitride spacers reduces shadowing effect of polysilicon implant, and an operation of forming the metal silicide on the substrate. Additionally, the method includes an operation of performing second trim-back of the main nitride spacers to increase the space between two adjacent replacement gate structures on the substrate to further increase the contact yield.

In yet another embodiment, a method of trimming back main nitride spacers of replacement gate structures on a substrate is provided. The method includes an operation of forming main nitride spacers for replacement gate structures on the substrate. The replacement gate structures have a high dielectric constant (high-K) dielectric layer and a dummy polysilicon layer over the high-K dielectric layer, and a hard mask with an oxide layer over a nitride layer. The method also includes an operation of performing source and drain implants. Source and drain patterns are formed to allow source and drain implants to be performed on desired regions of the substrate and the source and drain patterns are removed from the substrate after the source and drain implants are performed. The method further includes an operation of performing first trim-back of the main nitride spacers to increase a space between two adjacent replacement gate structures on the substrate to allow proper formation of metal silicide by subsequent processing and to increase contact yield, and an operation of performing source and drain anneal. In addition, the method includes an operation of forming the metal silicide on the substrate, and an operation of performing second trim-back of the main nitride spacers to increase the space between two adjacent replacement gate structures on the substrate to further increase the contact yield.

Other aspects and advantages of the invention will become apparent from the following detailed description, taken in conjunction with the accompanying drawings, illustrating by way of example the principles of the invention.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION OF THE EXEMPLARY EMBODIMENTS

Figure 1:
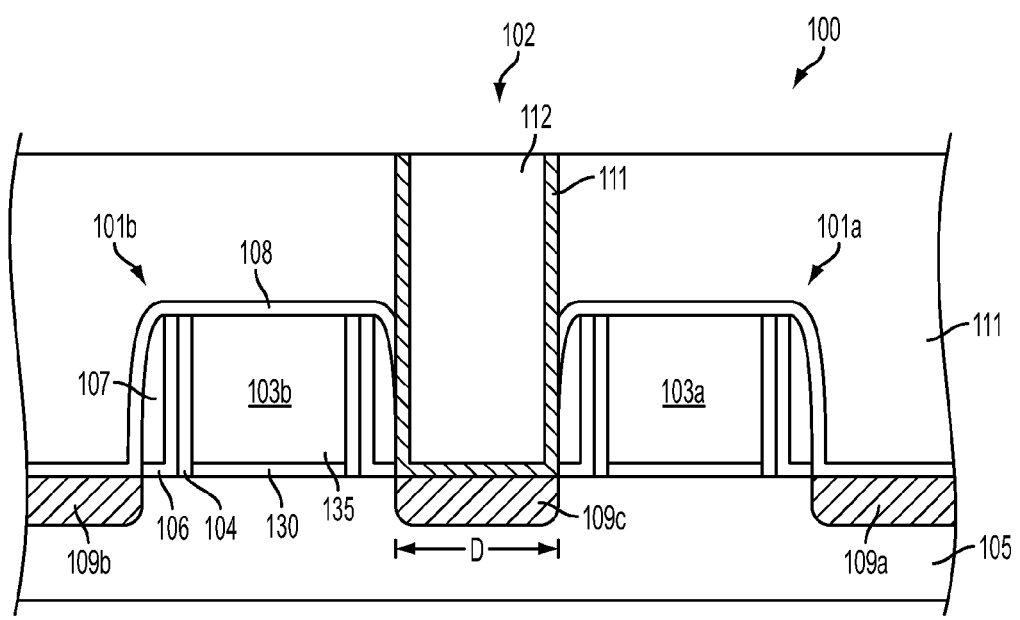
FIG. 1 shows a cross-section of device area with two adjacent gate structures and a contact plug, in accordance with one embodiment of this disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 shows a cross-section of device area 100 with two adjacent gate structures 101a, 101b and a contact plug 102, in accordance with one embodiment of this disclosure. The device area 100 is built on a substrate 105. The gate structures 101a, 101b have two gate stacks 103a, 103b respectively. Gate stacks 103a, 103b have a number of layers in the stacks. For example, the gate stacks 103a, 103b may include a gate dielectric layer 130, which can be a silicon oxide layer, an oxy-nitride composite layer, a high-dielectric constant (high-K) dielectric layer, or an high-K dielectric layer over an oxide layer. The gate stacks 103a, 103b may also include a gate layer 135, which is made of a conductive material, such as polysilicon, or a metal. For example, the material of the metal may be Al, Al alloy, Ti, TiN, Ta, TaN, or other suitable metal. The gate stack 103a, 103b may also include other layers, such as a barrier layer and/or a workfunction layer for replacement gates (not shown).

In one embodiment, the sidewalls of gate stacks 103a, 103b are protected by a seal layer 104, which is made of one or more dielectric materials. In one embodiment, the seal layer 104 is made of a composite layer of oxide and nitride. The seal layer 104 is used to isolate the materials in the gate stacks from the processing environment. For example, the seal layer is about 4-5 nm. However, in some embodiments, the seal layer 104 is not needed. The gate stacks 103a, 103b are surrounded by spacers, which are made of dielectric material(s). Spacers are used to isolate the gate dielectric layer from the surrounding salicide regions 109a, 109b, 109c, and contacts to prevent leakage and shorting. Spacers can be made of a single layer (only main nitride spacer layer), or of multiple layers. The embodiment shown in FIG. 1 includes a L-shape thin oxide layer 106 and a main nitride spacer layer 107. The L-shape thin oxide layer 106 helps to reduce the stress caused by the main nitride spacer layer 107. For example, the L-shape thin oxide layer 106 is about 2-3 nm.

The gate stacks 103a, 103b are covered by a nitride etch stop layer 108, which extends to substrate surface that are not covered by the gate stacks 103a, 103b and contact hole 102. Between the gate stacks 103a, 103b, there is a silicide region 109c, which may also exist in other part of substrate, such as region 109a and 109b. The contact plug 102 may be filled with an adhesion (or barrier) layer 111 and a metallic material 112, such as tungsten (W). The contact plug 102 lands on the silicide region 109 and is surrounded by a dielectric material 110.

For advanced processing technologies, the space "D" between two adjacent gate structures such as 101a, 101b may be 0.25 μm or lower, and the aspect ratio of such space may be equal to or greater than 1.5. The decreasing dimension of space "D" and increasing of aspect ratio make the silicide formation in regions, such as 109a, 109b, and 109c, more difficult because it's harder for silicide metal to be deposited in the space. Further, advanced salicide formation often involves implant of polysilicon on the silicide metal to improve the quality of silicide. The decreasing space "D" increases the aspect ratio between two adjacent gate structures and prevents the polysilicon from reaching the surface of region 109c. If metal silicide is not formed properly, the resistance of the silicide can be very high, which can impact contact yield. In addition, the tight spacing makes the patterning and landing of the contact plug 102 more challenging. For example, the limited spacing can make contact hole in region 109c not open or not open completely. The limited spacing can also affect the gap-fill of the contact plug 102. Without sufficient landing area for contact plugs, such as plug 102, the resistance of interconnect can be very high. All these issues can decrease contact yield.

Main spacers 107 are used to isolate the gate dielectric 120 from the surrounding conductive areas, such as silicide regions and contact plugs. About 50 Å (angstroms) of main nitride spacers is required to ensure that there is no leakage between gate dielectric 130 and contact 112, or between gate dielectric 130 and silicide region 109c. During spacer formation, thicker nitride film, such as about 200 Å to about 3000 Å, is deposited to ensure sufficient nitride coverage across the entire substrate. The deposited nitride layer is then etched back to form main spacers 107. For example, the average thickness of the main nitride spacer may be between about 25 nm to about 40 nm. Sufficient thickness of the main nitride spacers is needed to allow source and implant to be performed at relatively high dosage and energy. After source and drain implant, the spacers can be trimmed (or etched) to be thinner to increase the distance of space "D" to improve silicide (or salicide) quality and to improve contact yield.

Figure 2A:
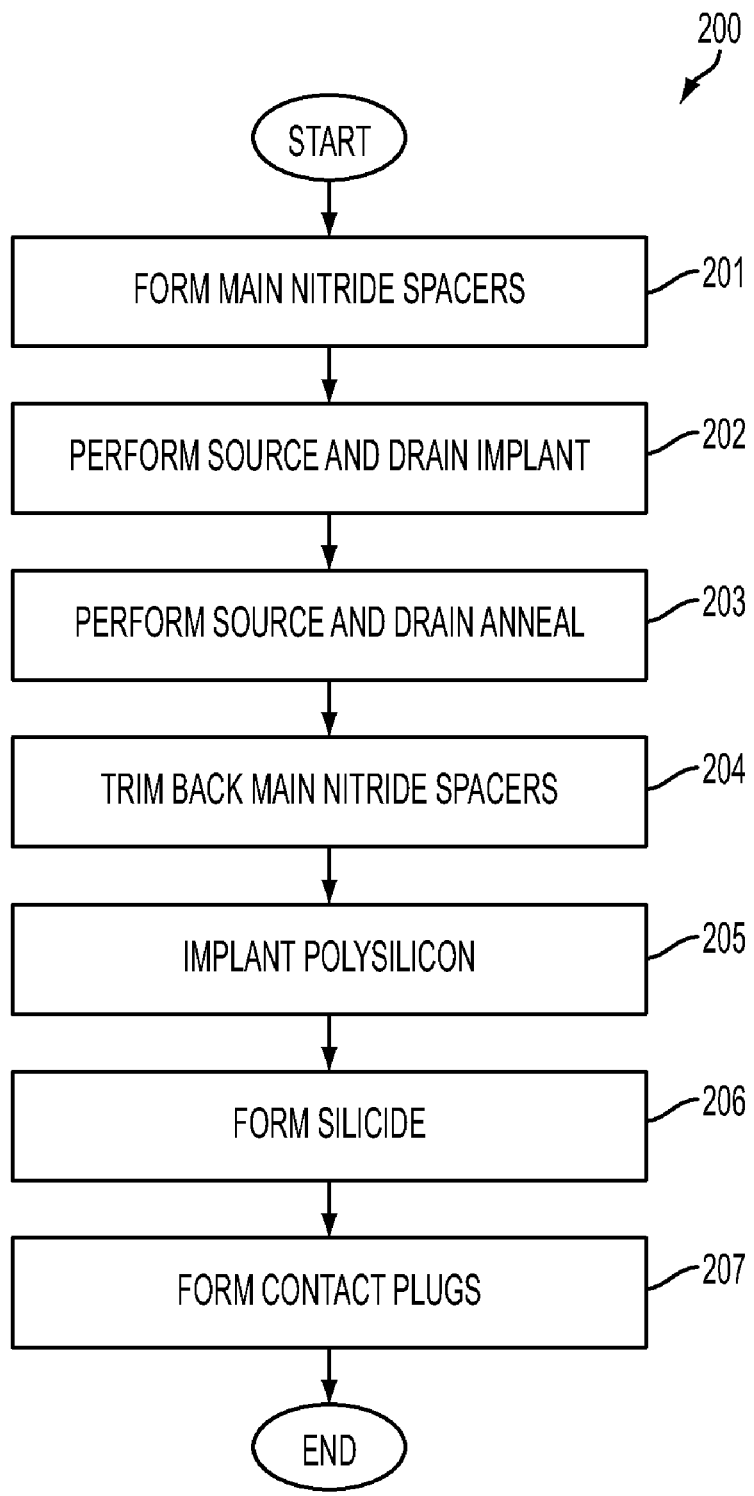
FIG. 2A shows a process flow for main spacer trim back and silicide formation, in accordance with one embodiment of this disclosure.
Figure 2B:
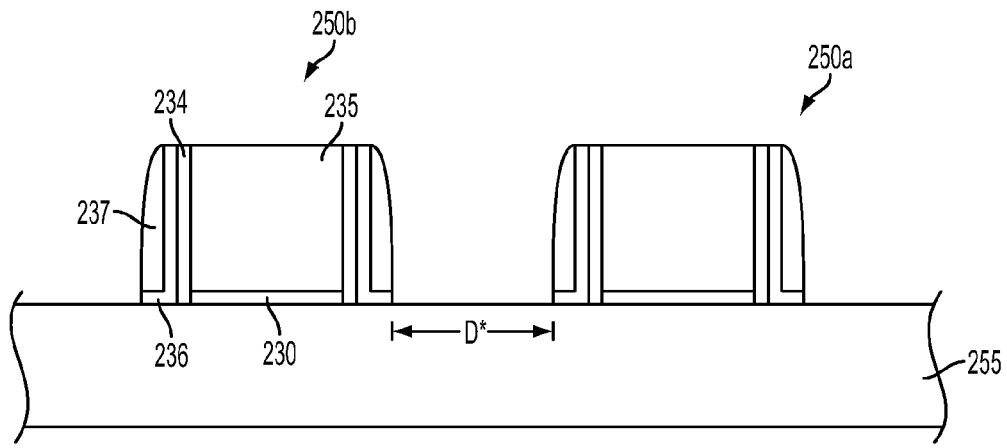
FIG. 2B shows structures of gate stacks including a gate dielectric layer and a polysilicon gate layer, in accordance with one embodiment of this disclosure.

FIG. 2A shows a process flow 200 for main spacer trim back and silicide formation, in accordance with one embodiment of this disclosure. At operation 201, main nitride spacers are formed to surround the gate stacks. FIG. 2B shows that the gate stacks 250a, 250b including a gate dielectric layer 230 and a polysilicon gate layer 235, in accordance with one embodiment of this disclosure. A seal layer 234 covers the sidewalls of the gate stack. An L-shaped thin oxide layer 236 is deposited between the gate stack (with the seal layer) and the main nitride spacer layer 237. Both layers are etched back to form the spacers on the sidewalls of the gate stacks 250a, 250b. The distance between two neighboring main nitride spacers 237 is "D*". The gate stacks on formed on substrate 255. Substrate 255 could have received other treatment and processing, such as lightly doped drain (LDD) implant, etc.

Figure 2C:
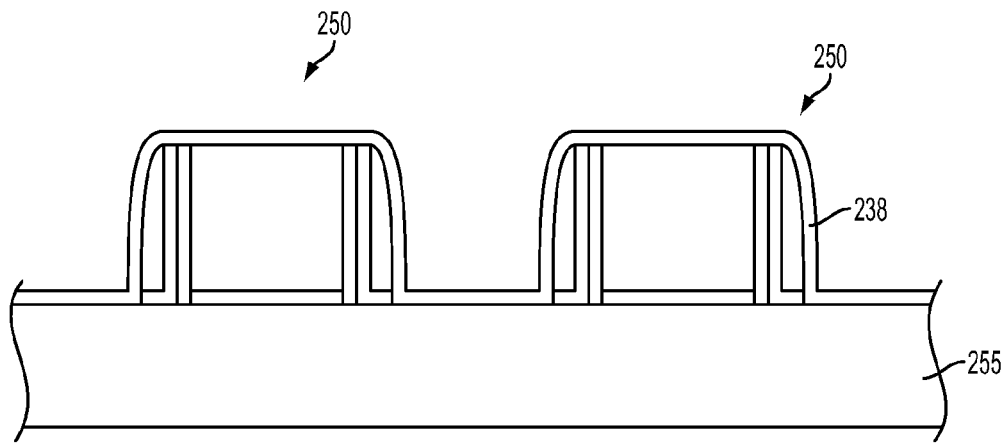
FIG. 2C shows a protective oxide layer being deposited over the substrate, in accordance with one embodiment of this disclosure.

After the main spacers 237 are formed, source and drain (or S/D) implants are performed at operation 202. The operation 202 includes patterning to define regions for S/D implants. In one embodiment, the source and drain implant includes additional electrostatic source and drain implant. Afterwards, source and drain (S/D) anneal is performed at operation 203. The annealing the substrate to drive dopants in the source and drain regions into the substrate, wherein the protective oxide layer is deposited on the substrate before the substrate is annealed to prevent boron out-gassing. In one embodiment, operation 203 includes depositing a protective oxide layer to protect the boron in the S/D regions from out-gassing during source/drain anneal. The protective oxide layer does not have to be very thick. For example, the thickness of the protective oxide layer can be between about 100 Å to about 500 Å. FIG. 2C shows a protective oxide layer 238 being deposited over the substrate, in accordance with one embodiment of this disclosure. After the substrate undergoes S/D anneal, the protective oxide layer 238 is removed from device regions to allow silicide formation in these regions and is left to cover the peripheral regions before silicide formation. Photo-resist spinning, photo-mask patterning, and etching are involved to pattern the protective oxide layer.

Figure 2D:
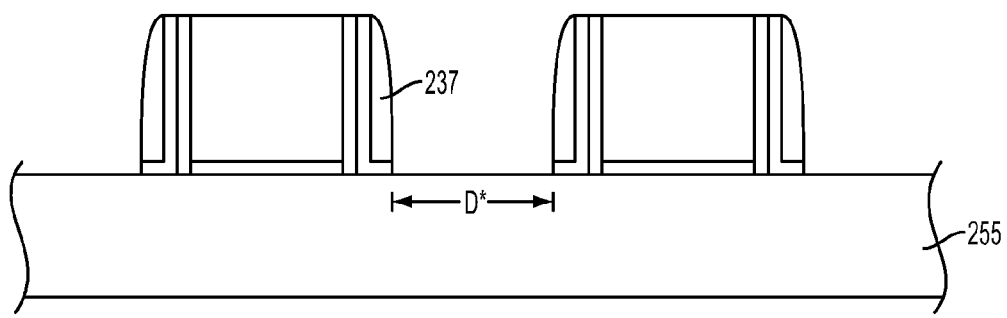
FIG. 2D shows the structures of FIG. 2C after the operation of source and drain anneal is completed, in accordance with one embodiment of this disclosure.
Figure 2E:
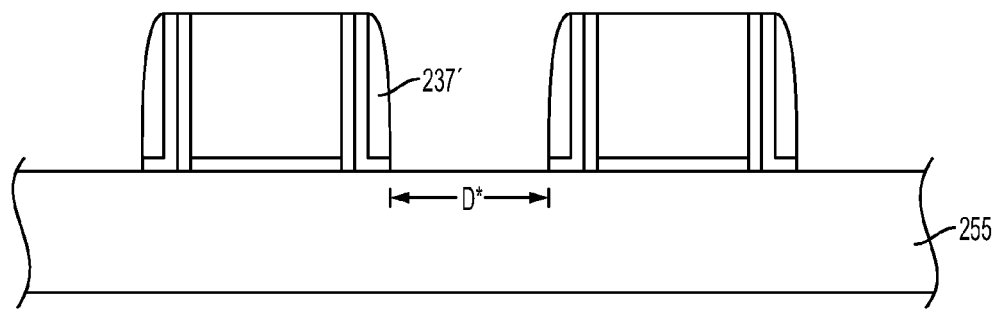
FIG. 2E shows the structures of FIG. 2D after main nitride spacer trim-back, in accordance with one embodiment of this disclosure.

FIG. 2D shows the structures of FIG. 2C after operation 203 is completed, in accordance with one embodiment of this disclosure. In the device regions shown in FIG. 2D, the protective oxide layer 238 is removed. After S/D anneal is performed and the protective oxide is removed, the main spacers are trimmed back at operation 204. The nitride trim-back can be performed by any applicable nitride etching processes, which can be a wet process, a dry process, or a combination of wet and dry processes. FIG. 2E shows the structures of FIG. 2D after main nitride spacer trim-back, in accordance with one embodiment of this disclosure. The trimmed main spacers 237' are thinner than the main spacers 237 shown FIGS. 2B-2D. The thinner main spacers open up the space "D*'" between the two gate stacks 250a, 250b.

After operation 204, a polysilicon implant is performed at operation 205. The polysilicon implant allows the silicon surface to be covered by polysilicon, which improves the silicide quality when the silicide is formed by subsequent processing. One key challenge in developing a salicide (or silicide) process is controlling the specific phase (or compound) formed by the silicide-metal/silicon reaction. Implanted polysilicon on the silicon surface improves the quality (or compound, or phase) of metal silicide formed. As mentioned earlier, the wider distance of "D*'" allows more polysilicon to reach the silicon surface in tight spaces, such as between two adjacent gate stacks. However, the trim-back of main nitride spacers cannot be too extensive to prevent silicide encroachment when silicide is formed later. Sufficient thickness of the main nitride spacers is needed to prevent silicide encroachment.

Figure 2F:
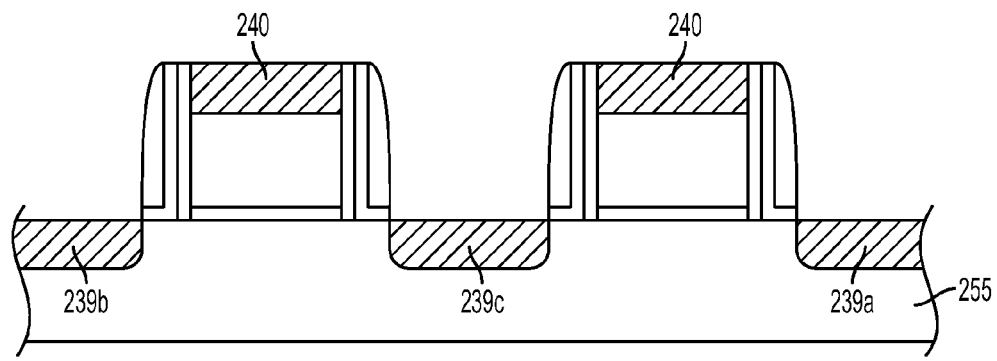
FIG. 2F shows the structures of FIG. 2E after silicide formation, in accordance with one embodiment of this disclosure.

After polysilicon is implanted, the process flow continues to silicide formation at operation 206. The operation of silicide formation includes the deposition of silicide metal and thermal annealing following the metal deposition. Examples of transitional metals used in salicide technology include titanium, cobalt, nickel, platinum, and tungsten. The thermal anneal can be a rapid thermal annealing, which allows the silicide metal, such as Ni, to form metal silicide with silicon and polysilicon on the substrate surface. The operation of silicide formation can further include a main nitride etching process to reduce the thickness of main nitride spacers, to increase the distance between two adjacent gate structures, and to reduce the aspect ratio(s) between two adjacent gate structures. FIG. 2F shows the structures of FIG. 2E after silicide formation, in accordance with one embodiment of this disclosure. Silicide is formed in S/D regions, such as 239a, 239b, 239c, and on polysilicon gates, region 240.

Figure 2G:
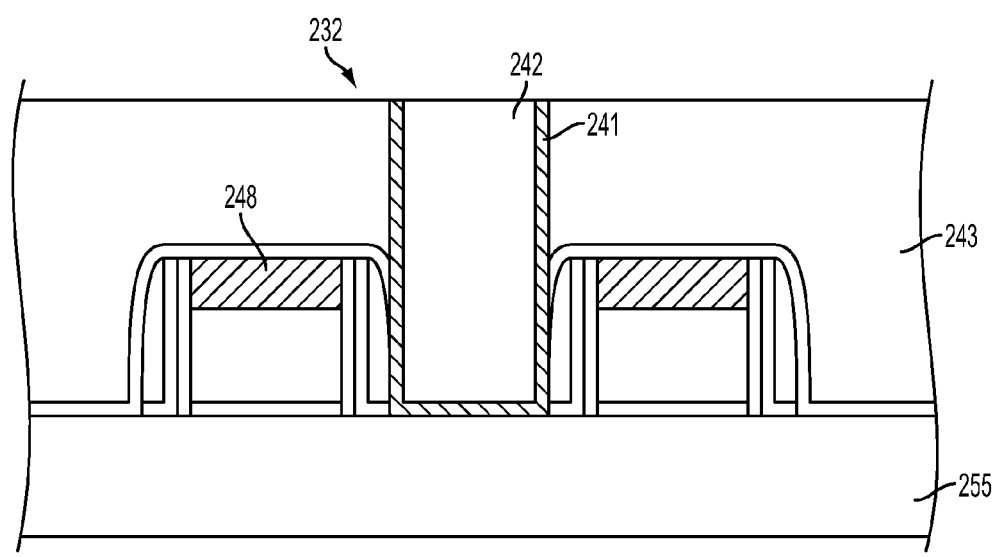
FIG. 2G shows the layers related to a contact plug, in accordance with one embodiment of this disclosure.

After silicide is formed, additional process operations are performed to form contact plug at operation 207. The operation may include depositing a contact etch stop layer under the pre-metal dielectric layer. FIG. 2G shows the contact etch stop layer 248, the pre-metal dielectric layer 243, and the contact plug 232 with the adhesion layer 241 and the plug metal 242, in accordance with one embodiment of this disclosure. The adhesion (or barrier) layer 241 could be any adhesion promoting film, such as Ti, Ta, TiN, TaN, or a combination of the above-mentioned films. The materials for the plug metal 242 could be any conductive film with low resistivity and good step coverage, such as W by chemical vapor deposition (CVD).

By trimming back the main nitride spacers, there is more room for silicide metal, such as Ni, to be deposited in the small silicide regions, such as region 239c. Further, the more opened spacing for the silicide region 239c also allow sufficient polysilicon to be implanted in the silicide region (or salicide region) 239c without being affected by the shadowing effect of the neighboring gate stacks 250a, 250b. In addition, as described above in FIG. 1, the wider spacing (D*') of the silicide region 239c allows contact plug to have sufficient landing area in silicide region 239c and to have better deposition of adhesion layer and metal layer.

Figure 3A:
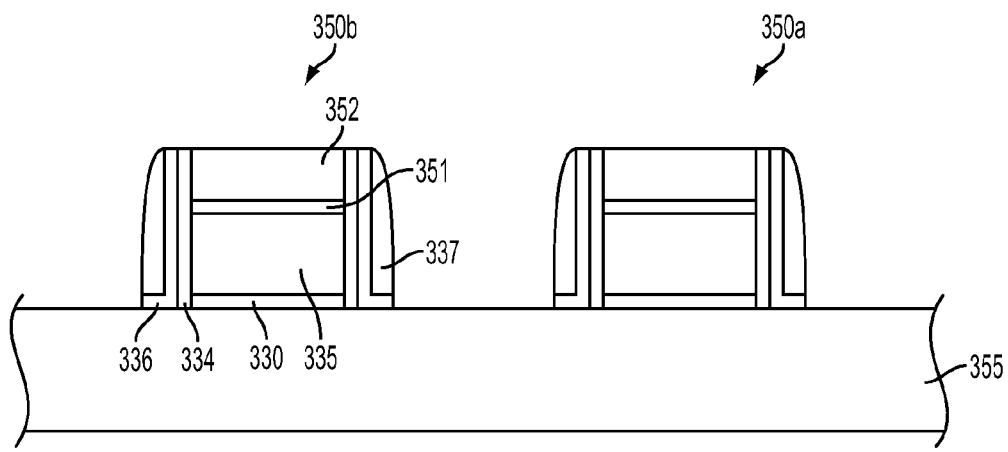
FIG. 3A shows two neighboring replacement gate stacks, in accordance with one embodiment of this disclosure.

The method described above applies for gate stacks formed by poly gate on oxide or oxynitride dielectric (or conventional gate-first structure). However, when such method is applied on replacement gate devices, problems arise. FIG. 3A shows two neighboring replacement gate stacks 350a, 350b, in accordance with one embodiment of this disclosure. The gate stacks 350a, 350b include a high-K dielectric layer 330 and a dummy polysilicon layer 335, which will be replaced with another dielectric material later. On top of the gate stacks 350a, 350b, there are dual hard mask layers (or a composite hard mask layer), which includes a thin nitride layer 351 and a thicker oxide layer 352. For example the thin nitride layer is between about 50 Å to about 200 Å, the oxide layer 352 is between about 50 Å to about 500 Å. On the sidewalls of the gate stack 350a, 350b and the hard-mask layers 351, 352, there are seal layers 334 protecting the gate stacks from being exposed to the processing environment. If the process flow for the replacement gate follows the process flow 200 described above for the conventional polysilicon-dielectric gate, the main nitride spacers are trimmed back after source and drain anneal. However, during the operation of source and drain anneal (operation 203 of FIG. 2A), a protective oxide layer (layer 238 of FIG. 2C) has been deposited on the substrate and removed from the device regions. If similar process sequence is used, the majority of the thicker oxide layer 352 of the dual hard mask layers would be removed during the protective oxide removal process on some part of the substrate (due to process non-uniformity), which leaves only the thin nitride layer 351 on the gate stacks.

Figure 3B:
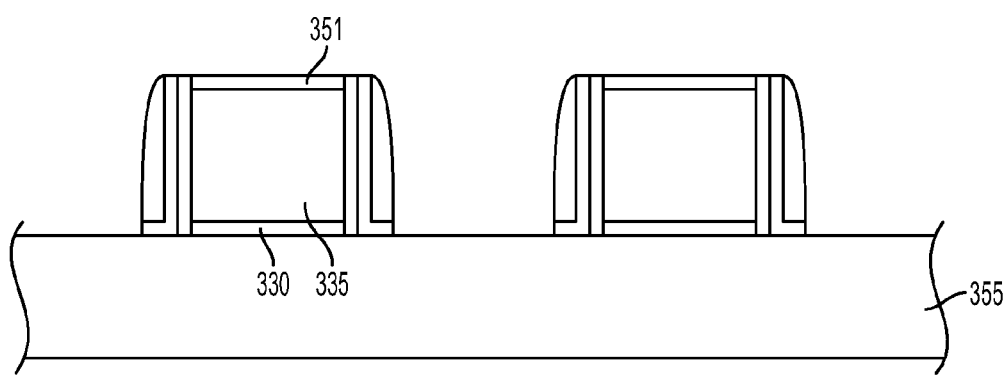
FIG. 3B shows the substrate of FIG. 3A after a source and drain anneal process sequence, in accordance with one embodiment of this disclosure.
Figure 3C:
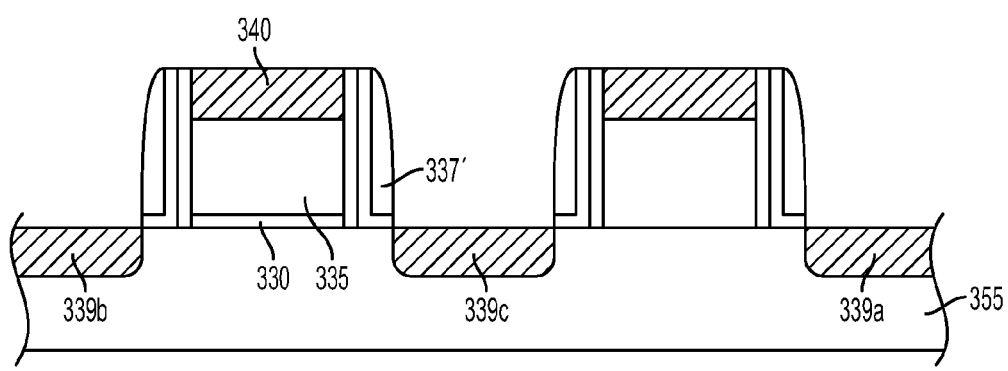
FIG. 3C shows silicide regions, and polyscide regions on top of dummy polysilicon of gate stacks, in accordance with one embodiment of this disclosure.

FIG. 3B shows the substrate of FIG. 3A after the S/D anneal process sequence, which removes the protective oxide layer in the device regions, in accordance with one embodiment of this disclosure. Since only the thin nitride layer 351 is left on the gate stacks on some part of the substrate, trimming back main nitride spacers at this point would remove the remaining thin nitride layer 351 and leaves the dummy polysilicon 335 exposed. The exposed dummy polysilicon 335 would be converted to silicide during silicide formation. FIG. 3C shows silicide regions 339a, 339b, 339c, and polyside regions 340 on top of dummy polysilicon of gate stacks 350a, 350b, in accordance with one embodiment of this disclosure. Once the polyside 340 is formed, it is very hard to remove. With the polyside 340 on top of the dummy polysilicon 335, the dummy polysilicon 335 will not be able to be replaced with another metal at a later process step. Depositing a thicker oxide layer 352 to make sure that some oxide remains on top of the thin nitride layer 351 to allow nitride trim-back is not a good option. Thicker oxide layer 352 would result in higher aspect ratio of the space between two neighboring gate stacks, which make implant more difficult due to shadowing effect. Therefore, the process sequence described above in FIG. 2A does not work for devices made with replacement gate processes.

Figure 4A:
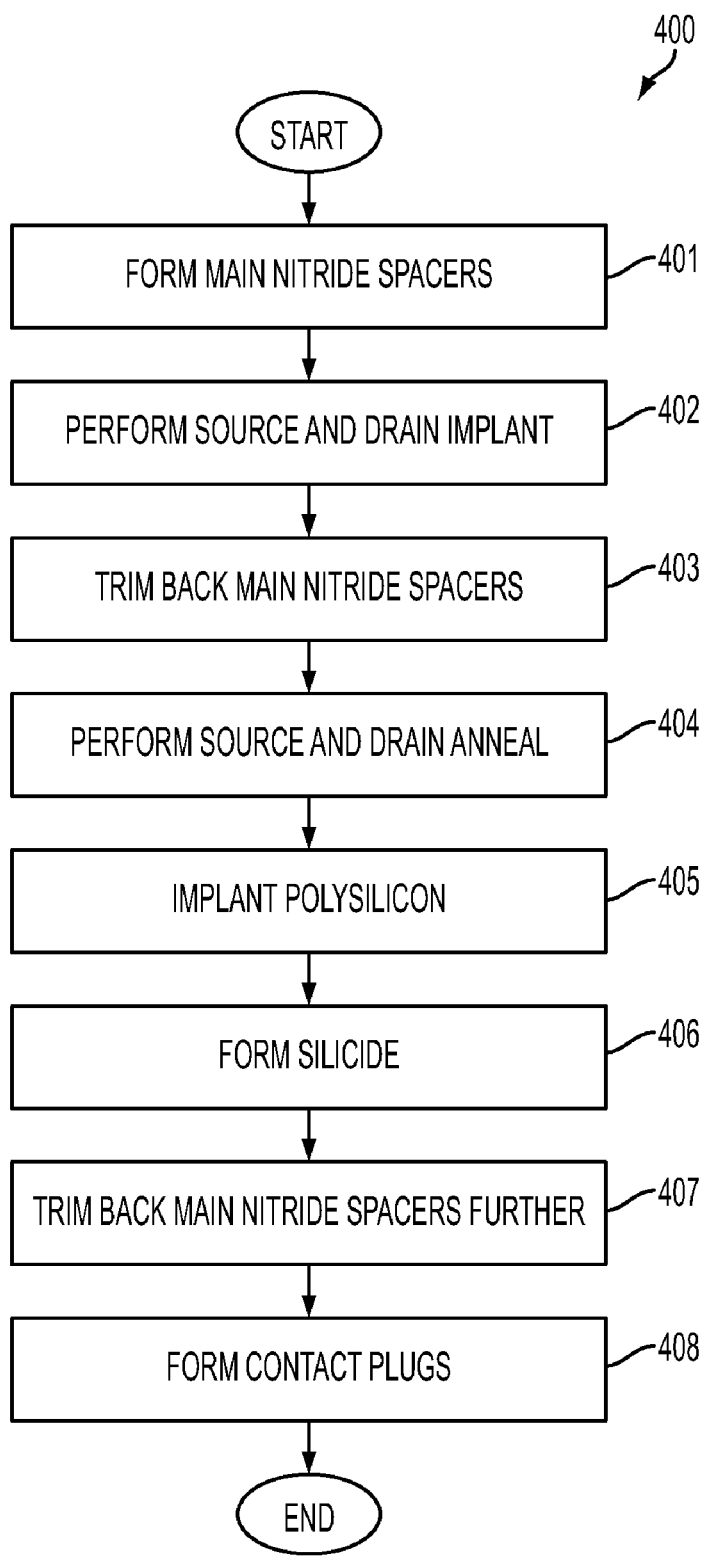
FIG. 4A shows a process flow of main nitride spacer trimback, in accordance with one embodiment of this disclosure.

In order to perform trim-back for main nitride spacers, the trim-back process needs to be performed before the removal of hard-mask layers. FIG. 4A shows a process flow 400 of main nitride spacer trim-back, in accordance with one embodiment of this disclosure.

Figure 4B:
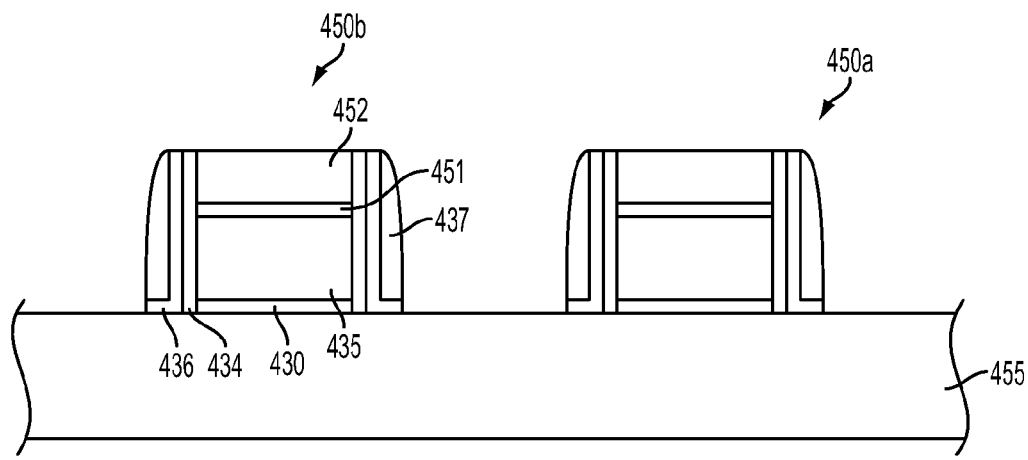
FIG. 4B shows that the cross-section of gate stacks, in accordance with one embodiment of this disclosure.

At operation 401, main nitride spacers are formed to surround the gate stacks. FIG. 4B shows that the cross-section of gate stacks 450a, 450b, in accordance with one embodiment of this disclosure. The gate stacks 450a, 450b include a gate dielectric layer 430 and a dummy polysilicon layer 435. A dual-layer hard mask layer, which includes a thin nitride layer 451 and a thick oxide layer 452, is on top of the dummy polysilicon layer 435. A seal layer 434 covers the sidewalls of the gate stacks. An L-shaped thin oxide layer 436 is deposited between the gate stack (with the seal layer) and the main nitride spacer layer 437. Both layers are etched back to form the spacers on the sidewalls of the gate stacks 450a, 450b. The distance between two neighboring main nitride spacers 437 is "DA". The gate stacks on formed on substrate 455. As described above, substrate 455 could have received other treatment and processing, such as lightly doped drain (LDD) implant, etc.

Figure 4C:
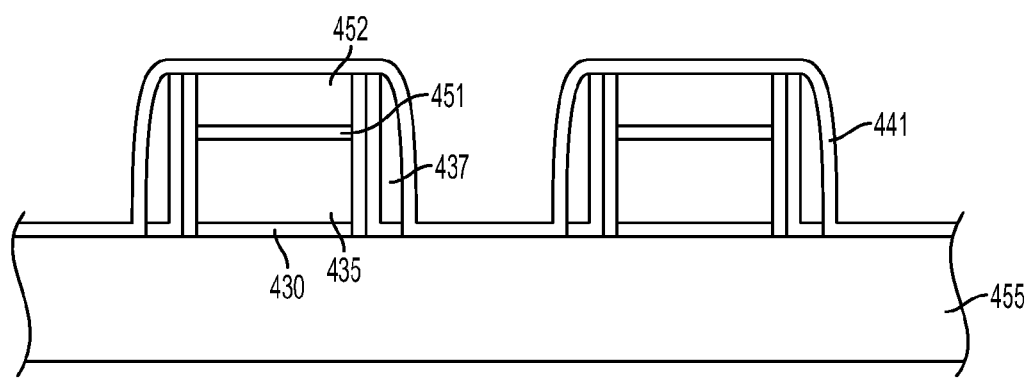
FIG. 4C shows the structures of FIG. 4B after a source and drain implant operation, in accordance with one embodiment of this disclosure.

After the main spacers 437 are formed, source and drain (or S/D) implants are performed at operation 402. Operation 402 is similar to operation 202 described above and includes patterning to define regions for S/D implants. Instead of performing S/D anneal next (as in the process flow of FIG. 2A), the main nitride spacer trim-back is performed at next operation 403. During S/D implant process sequence, resist patterning has been performed to define source and drain regions to select appropriate regions for implant. The resist removal process involves resist ashing and cleaning, which oxidize the surface of the substrate, including the surface of nitride spacers. The surface oxide layer is fairly thin, such as between about 20 Å to about 100 Å. FIG. 4C shows the structures of FIG. 4B after S/D implant operation 402 with a thin oxide layer 441 (as illustrated by the dark layer 441 in FIG. 4C) covering the substrate, in accordance with one embodiment of this disclosure. In order to trim back nitride spacers, the thin surface oxide layer needs to be removed first. Therefore, operation 403 includes removing the thin oxide layer and the trim-back of the main nitride spacers. The oxide removal process can be performed by a wet or dry oxide etching or dipping. For example, a diluted HF solution (100:1 HF to water ratio) can be used for a short period of time, such as between about 10 seconds to about 1 minute. The etching time should not be too long to prevent removal of the L-shape oxide spacers. FIG. 4C shows the structures of FIG. 4B after the thin oxide layer 441 is removed.

After the thin oxide layer 441 is removed, the nitride spacers are trimmed back by nitride etching chemistry(ies). The nitride etching chemistry(ies) yes can be a wet process, a dry process, or a combination of wet and dry processes. An example of a wet nitride etch process utilizes phosphorous acid ($H_3PO_4$) at about 120° C. The etching time depends how much nitride is to be removed. For example, the etching time is between about 1 minute to about 3 minutes. As mentioned above, the trim-back of main nitride spacers cannot be too extensive to prevent silicide encroachment when silicide is formed later. Sufficient thickness of the main nitride spacers is needed to prevent silicide encroachment.

After main nitride spacer trim-back, source and drain anneal is performed at operation 404. Operation 404 is similar to operation 203 described above. Operation 404 is followed by operation 405, which implants polysilicon to improve silicide quality. Operation 405 is similar to operation 205 described above. Silicide is formed afterwards at operation 406. The operation of silicide formation includes the deposition of silicide metal and thermal annealing following the metal deposition. Examples of transitional metals used in salicide technology include titanium, cobalt, nickel, platinum, and tungsten. The thermal anneal can be a rapid thermal annealing, which allows the silicide metal, such as Ni, to form metal silicide with silicon and polysilicon on the substrate surface.

After silicide formation, there is an optional operation 407. At operation 407, the main nitride spacers are further etched to increase the distance between two adjacent gate structures, and to reduce the aspect ratio(s) between two adjacent gate structures. The etching process can be wet, or dry, or a combination of both. For example, a wet nitride etching process utilizing $H_3PO_4$ at 120° C. can be applied for a duration between about 1 minute to about 5 minutes.

Figure 4D:
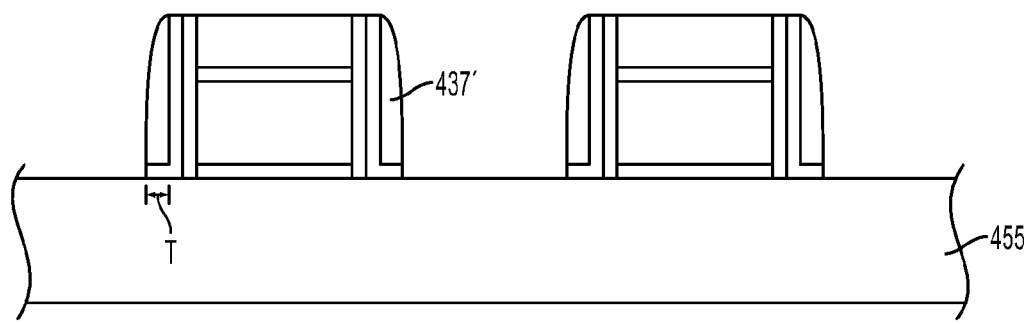
FIG. 4D shows the structures of FIG. 4C after trim-back of main nitride spacers, in accordance with one embodiment of this disclosure.

FIG. 4D shows the structures of FIG. 4C after trim-back of main nitride spacers, in accordance with one embodiment of this disclosure. The remaining main nitride spacers 437' is thinner than main nitride spacers 437 of FIGS. 4B and 4C. As mentioned above, about 50 Å of main nitride spacers is needed to ensure that there is no leakage between the gate dielectric and the contact plug, or between the gate dielectric and the neighboring silicide regions. The minimum thickness "T" of main nitride spacers after nitride trim back needs to be equal to or greater than 50 Å anywhere on the substrate. The thickness of main nitride spacers after trim back depends on the process control of the nitride deposition and etching (or trim-back) processes, since both processes can contribute to the thickness variation. If both processes have low variation, the final average thickness target can be between about 6 nm to about 8 nm (or 60-80 Å). However, if the process control is not as good, thicker post trim back nitride thickness, such as 10 nm or higher, could be needed. In another embodiment, the final average thickness target is between 8 nm to about 10 nm (or 80-100 Å). In yet another embodiment, the final average thickness target is between 10 nm to about 15 nm (or 100-150 Å).

Figure 4E:
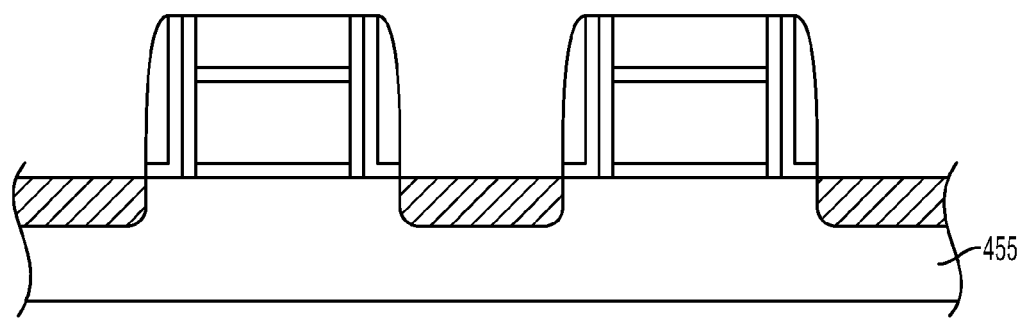
FIG. 4E shows the structures of FIG. 4D after additional operations involving source and drain anneal, implant of polysilicon, and silicide formation are completed, in accordance with one embodiment of this disclosure.

FIG. 4E shows the structures of FIG. 4D after operations 404, 405, 406, and 407 are completed, in accordance with one embodiment of this disclosure. Afterwards, additional process steps are used to remove the remaining photoresist and hard mask, to replace the dummy polysilicon with a conductive metal, to deposit pre-metal dielectric layer, and to form contact plugs at operation 408.

Since the nitride spacers have been trimmed back, the spacing between the two gate structures is bigger and the aspect ratio of the space is lower to allow better silicide metal deposition (better step coverage) and better pre-silicide-formation polysilicon implant (less shadowing effect). Better silicide metal deposition and better polysilicon implant would result in improved (or better) formation of metal silicide. Also as mentioned above, the wider spacing between the two gate structures also allows contact to form a and land better, and increases contact yield.

The process sequence (or method) mentioned above for trimming back nitride spacers for replacement gates allows the hard mask layers to protect the polysilicon above the high-K dielectric during trim back process. The process sequence also allows determining the trim-back amount based on the process uniformity (or control) of nitride deposition and nitride etchback (or trimming) processes. As mentioned above, the minimal main nitride spacer thickness should be controlled to be about 50 Å. Nitride spacer trim-back process integration is critical to avoid creating undesirable consequences, such as silicided polyisicon on top of high-K dielectric described above. The process also allows widening the space between the gate structures and lowering the aspect ratio of such space to allow formation of silicide with good quality and allow contact plugs to have sufficient contact with the silicide regions. The silicide with good quality and good contact between the contact plugs and the silicide regions increase the yield of contact and allows the contact resistance to be in acceptable and workable ranges.

Various modifications, changes, and variations apparent to those of skill in the art may be made in the arrangement, operation, and details of the methods and systems disclosed. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of trimming back main spacers of replacement gate structures on a substrate, comprising:

forming main spacers for replacement gate structures on the substrate, wherein the replacement gate structures have a dielectric layer, a dummy layer over the dielectric layer, and a hard mask over the dummy layer;

performing source and drain implants, wherein source and drain patterns are formed to allow source and drain implants to be performed on desired regions of the substrate and the source and drain patterns are removed from the substrate after the source and drain implants are performed;

trimming back the main spacers to increase a space between two adjacent replacement gate structures on the substrate to allow proper formation of metal silicide by subsequent processing;

after said trimming back, performing source and drain anneal; and forming the metal silicide on the substrate.

2. The method of claim 1, further comprising:

implanting polysilicon on the substrate before the forming of the metal silicide, wherein the implanted polysilicon improves the quality of the metal silicide formed, and wherein the trimming back of the main spacers reduces a shadowing effect of polysilicon implant.

3. The method of claim 1, wherein the forming of the metal silicide on the substrate comprises:

depositing a silicide metal layer on the substrate, wherein the trimming back of the main spacers improves the step coverage of the deposition of the silicide metal layer; and annealing the substrate to form the metal silicide.

4. The method of claim 1, wherein the main spacers are trimmed back to a minimal thickness of about 50 Å across the substrate.

5. The method of claim 1, wherein the trimming back of the main spacers is accomplished by using phosphorous acid ($H_3PO_4$) at about 120° C. for from about 1 minute to about 3 minutes.

6. The method of claim 1, wherein the performing of the source and drain anneal comprises:

depositing a protective oxide on the substrate;

annealing the substrate to drive dopants in the source and drain regions into the substrate, wherein the protective oxide layer is deposited on the substrate before the substrate is annealed to prevent boron out-gassing; and patterning the protective oxide layer after the annealing of the substrate to allow the metal silicide to be formed on a part of the substrate.

7. The method of claim 1, wherein the trimming back of the main spacers increases landing areas for contact plugs to be formed on the metal silicide.

8. The method of claim 1, wherein a silicide metal used for forming the metal silicide is selected from the group consisting of titanium, cobalt, nickel, platinum, and tungsten.

9. The method of claim 1, further comprising:

after forming the metal silicide on the substrate, further trimming back the main spacers to increase the space between two adjacent replacement gate structures on the substrate.

10. The method of claim 1, wherein a thin oxide layer is formed on the substrate as a result of the removal of the source and drain patterns, and the method further comprises removing the thin oxide layer before the main spacers are trimmed back.

11. A method of trimming back main nitride spacers of replacement gate structures on a substrate, comprising:

forming main nitride spacers for replacement gate structures on the substrate, wherein the replacement gate structures have a high dielectric constant (high-K) dielectric layer, a dummy polysilicon layer over the high-K dielectric layer, and a hard mask with an oxide layer over a nitride layer;

performing source and drain implants, wherein source and drain patterns are formed to allow source and drain implants to be performed on desired regions of the substrate and the source and drain patterns are removed from the substrate after the source and drain implants are performed;

trimming back the main nitride spacers to increase a space between two adjacent replacement gate structures on the substrate to allow proper formation of metal silicide by subsequent processing and to increase contact yield;

performing source and drain anneal; and forming the metal silicide on the substrate;

wherein a thin oxide layer formed on the substrate as a result of the removal of the source and drain patterns, and the method further comprises removing the thin oxide layer before the main nitride spacers are trimmed back.

12. The method of claim 11, the thin oxide layer formed on the substrate as a result of removing of the source and drain patterns is removed by using a 100:1 diluted HF solution for from about 10 seconds to about 1 minute.

13. A method of trimming back main nitride spacers of replacement gate structures on a substrate, comprising:

forming main nitride spacers for replacement gate structures on the substrate, wherein the replacement gate structures have a high dielectric constant (high-K) dielectric layer and a dummy polysilicon layer over the high-K dielectric layer, and a hard mask with an oxide layer over a nitride layer;

performing source and drain implants, wherein source and drain patterns are formed to allow source and drain implants to be performed on desired regions of the substrate and the source and drain patterns are removed from the substrate after the source and drain implants are performed;

performing first trim-back of the main nitride spacers to increase a space between two adjacent replacement gate structures on the substrate to allow proper formation of metal silicide by subsequent processing and to increase contact yield;

performing source and drain anneal;

implanting polysilicon on the substrate before the forming of the metal silicide, wherein the implanted polysilicon improves the quality of the metal silicide formed, and wherein the first trim-back of the main nitride spacers reduces shadowing effect of polysilicon implant;

forming the metal silicide on the substrate; and performing second trim-back of the main nitride spacers to increase the space between two adjacent replacement gate structures on the substrate to further increase the contact yield.

14. The method of claim 13, wherein a thin oxide layer is formed on the substrate as a result of the removal of the source and drain patterns, and the method further comprises removing the thin oxide layer before the first trim-back.

15. The method of claim 14, wherein the performing of the source and drain anneal comprises:

depositing a protective oxide on the substrate;

annealing the substrate to drive dopants in the source and drain regions into the substrate, wherein the protective oxide layer is deposited on the substrate before the substrate is annealed to prevent boron out-gassing; and patterning the protective oxide layer after the annealing of the substrate to allow the metal silicide to be formed on a part of the substrate.

16. The method of claim 14, wherein the thin oxide layer formed on the substrate as a result of removing of the source and drain patterns is removed by using a 100:1 diluted HF solution for from about 10 seconds to about 1 minute.

17. The method of claim 13, wherein the forming of the metal silicide on the substrate further comprises:

depositing a silicide metal layer on the substrate, wherein the first trim-back of the main nitride spacers improves the step coverage of the deposition of the silicide metal layer; and annealing the substrate to form the metal silicide.

18. The method of claim 13, wherein the main nitride spacers are trimmed back to a minimal thickness of about 50 Å across the substrate.

19. The method of claim 13, wherein each of the first and second trim-back of the main nitride spacers is accomplished by using phosphorous acid ($H_3PO_4$) at about 120° C. for between about 60 seconds to about 180 seconds.

20. The method of claim 13, wherein a silicide metal used for forming the metal silicide is selected from the group consisting of titanium, cobalt, nickel, platinum, and tungsten.

21. A method of trimming back main nitride spacers of replacement gate structures on a substrate, comprising:

forming main nitride spacers for replacement gate structures on the substrate, wherein the replacement gate structures have a high dielectric constant (high-K) dielectric layer a dummy polysilicon layer over the high-K dielectric layer, and a hard mask with an oxide layer over a nitride layer;

performing source and drain implants, wherein source and drain patterns are formed to allow source and drain implants to be performed on desired regions of the substrate and the source and drain patterns are removed from the substrate after the source and drain implants are performed;

performing first trim-back of the main nitride spacers to increase a space between two adjacent replacement gate structures on the substrate to allow proper formation of metal silicide by subsequent processing;

performing source and drain anneal;

forming the metal silicide on the substrate; and performing second trim-back of the main nitride spacers to increase the space between two adjacent replacement gate structures on the substrate.

* * * * *